United States Patent

McClure et al.

[11] Patent Number: 5,267,210
[45] Date of Patent: Nov. 30, 1993

[54] SRAM WITH FLASH CLEAR FOR SELECTABLE I/OS

[75] Inventors: David C. McClure; Mark A. Lysinger, both of Carrollton, Tex.

[73] Assignee: SGS-Thomson Microelectronics, Inc., Carrollton, Tex.

[21] Appl. No.: 25,894

[22] Filed: Mar. 3, 1993

Related U.S. Application Data

[63] Continuation of Ser. No. 691,154, Apr. 23, 1991, abandoned, which is a continuation of Ser. No. 195,696, May 18, 1988, abandoned.

[51] Int. Cl.⁵ ............................................. G11C 11/40
[52] U.S. Cl. .................................... 365/218; 307/465
[58] Field of Search ................. 395/400, 425, 750; 365/218, 195, 189.11, 182, 184, 185; 307/465

[56] References Cited

U.S. PATENT DOCUMENTS

| | | | |
|---|---|---|---|
| 4,408,306 | 10/1983 | Kuo | 365/218 |
| 4,442,510 | 4/1984 | Priel et al. | 365/218 |
| 4,567,578 | 1/1986 | Cohen et al. | 365/189 |
| 4,587,629 | 5/1986 | Dill et al. | 364/900 |
| 4,680,734 | 7/1987 | Baba et al. | 365/190 |
| 4,758,990 | 7/1988 | Uchida | 365/190 |
| 4,879,686 | 11/1989 | Suzuki et al. | 365/189.11 |
| 4,881,206 | 11/1989 | Kadono | 365/227 |
| 4,882,708 | 11/1989 | Hayakawa et al. | 365/189.04 |

FOREIGN PATENT DOCUMENTS

| | | |
|---|---|---|
| 0189700 | 8/1986 | European Pat. Off. . |
| 0257938 | 3/1988 | European Pat. Off. . |
| 0259967 | 3/1988 | European Pat. Off. . |

*Primary Examiner*—Kevin A. Kriess
*Attorney, Agent, or Firm*—Kenneth C. Hill; Lisa K. Jorgenson; Richard K. Robinson

[57] ABSTRACT

A static random access memory having multiple I/Os includes a memory array (10) of memory cells (42) with columns that are selectively clearable as a function of the associated I/O. The columns are arranged in pairs (34) with each column in the pair (34) associated with the same I/O. A clear signal is input thereto on a line (28) and driven by a driver (30). The clear signal is only associated with the pairs (34) associated with a selected I/O. The remaining columns of memory cells associated with unselected I/Os are not cleared.

20 Claims, 2 Drawing Sheets

SRAM WITH FLASH CLEAR FOR SELECTABLE I/OS

This is a continuation of application Ser. No. 07/691,154, filed Apr. 23, 1991, now abandoned, which is a continuation of application Ser. No. 07/195,696, filed May 18, 1988, now abandoned.

TECHNICAL FIELD OF THE INVENTION

The present invention pertains in general to memories, and more particularly, to a multiple I/O SRAM having the capability of clearing a selected I/O.

BACKGROUND OF THE INVENTION

The cache memory market is growing at a rapid pace with the advent of the high-performance 32-bit microprocessors. The cache memory is a small but fast memory block typically inserted between the CPU and the primary memory. The CPU fetches data and instructions from the cache when it is determined that the desired data and instructions reside in the cache. Since the cache memory is about ten times faster than the primary memory, the CPU-memory speed gap is considerably reduced when accessing the cache.

In the cache memory scheme, the primary memory and the cache memory are usually divided into equal-size pages. Required pages from the primary memory are first transferred into the cache and execution of the program begins with the CPU fetching data and instructions from the cache. If the address of the instruction to be executed or the data to be fetched is not in the cache memory (i.e., a miss), an appropriate page from the primary memory is transferred into the cache memory. If the address is in the cache memory (i.e., a hit), the execution of instructions from the cache continues. One method for writing data into a primary memory location using a cache scheme requires a tag to be associated with each cache page. The tag indicates whether a page is altered or not due to a memory Write operation. If not altered, the page is discarded and another required page is brought into the cache. Some type of virtual memory management scheme is required to manage the cache-primary memory instructions.

Since the cache memory compares each address generated by the microprocessor with the tag to determine if there is a hit, it is important that the integrity of this tag be maintained such that an invalid hit does not occur. An invalid hit can occur, for example, upon power up of the system since a random sequence of bits is initially stored in the tag. To determine the validity of the tags, one bit in each of the tags is designated as a valid bit. The I/O associated with this valid bit is typically tied to a positive voltage representing the logic high voltage which, when written to the valid bit, provides an indication of a valid tag. Initially, the entire memory is flash cleared such that all zeroes are stored in each of the tag bits until a tag is stored in the address cache, at which time the logic "1" is written in the valid bit for the tag written to. By determining whether the valid bit for the addressed tag is a logic "1", the presence of a hit can be determined.

In prior systems, the memory utilized for both the address cache and the data cache in the cache system utilized static random access memories (SRAM's). The entire memory was cleared upon power up of the system by storing a zero in each of the memory locations by various methods. One method required sequentially addressing all of the memory locations and forcing a zero therein. Another system forces all of the memory locations to zero. One disadvantage to this latter system is that drivers must be present which can drive all of the memory locations to a "0" logic state. In addition, some type of interconnection is required for each of the memory cells which increases the amount of space occupied by the memory array. Typically, each column of memory cells will require a separate run of conductive material to interface with each of the memory cells for the clear function. The drive requirements for clearing all of the memory cells results in relatively large drive transistors. In any event, it is not necessary to clear the entire memory since only one bit determines whether there is valid tag information in a cache memory. There therefore exists a need for a more versatile memory that allows clearing of less than all of the memory cells.

SUMMARY OF THE INVENTION

The present invention disclosed and claimed herein comprises a multiple I/O memory with selectably clearable I/Os. The memory includes an array of memory cells arranged in rows and columns with each of the rows accessible with a separate row address and each of the columns arranged in predetermined I/O groups and each column associated with a predetermined I/O. The memory cells are operable to force the logic state stored therein to a first logic state in the presence of a clear signal. An externally generated clear signal is selectively input to columns of memory cells associated with a selected I/O. Therefore, only the columns of memory cells associated with a selected I/O are forced to the first logic state in the presence of the clear signal.

In another aspect of the present invention, some of the memory cells embodied in a monolithic integrated circuit are grouped together in pairs such that each pair consists of two columns of memory cells each associated with the same I/O and each associated with an adjacent column address. Each of the memory cells has a clear input which is connected to a common first conductive run which is disposed adjacent and parallel to each of the columns of memory cells in the pair. The first conductive runs for the columns of memory cells associated with the selected I/O are connected to a second conductive run disposed adjacent to the array proximate to each of the columns of memory cells. The second conductive run is interfaced with the externally generated clear signal. A driver is provided for driving the distributed capacitance of the first and second conductive runs. Memory cells associated with columns that are not associated with the selected I/O are connected to a source reference voltage instead of to the clear signal; accordingly, the FLASH CLEAR function is not provided for those memory cells.

In yet another aspect of the present invention, each of the memory cells is comprised of a static memory cell. The memory cell includes two cross-coupled MOS N-channel transistors having the drains thereof connected to first and second sense nodes, respectively. The source of one of the cross-coupled transistors is connected to a source reference voltage and the source of the second cross-coupled transistor is connected to the clear input. The first and second sense nodes are respectively connected to the drain supply through a pull up device. When the voltage on the clear input is raised to the drain supply voltage, the logic state of the memory cell is forced to a logic "0"; and when the voltage on the clear input is clamped to the source reference voltage, the memory cell operates in a standard manner.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
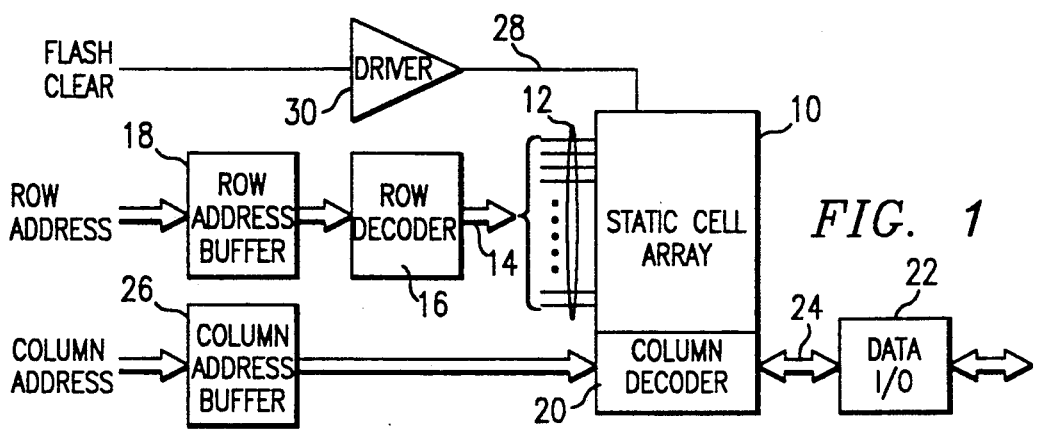
FIG. 1 illustrates a block diagram of an SRAM utilizing the FLASH CLEAR feature of the present invention.

Referring now to FIG. 1, there is illustrated a block diagram of an SRAM which may be conveniently fabricated in a monolithic integrated circuit and which utilizes the FLASH CLEAR scheme of the present invention. The memory is comprised of a static cell array 10 which is comprised of a plurality of static memory cells (not shown) arranged in rows and columns. A row of memory cells is selected by activating one of a plurality of Word Lines 12, which are connected to a Word Line bus 14. The Word Line bus 14 is connected to the output of a row decode circuit 16 that is operable to decode a row address which is buffered by a row address buffer 18. The row decode circuit 16 has a mutually exclusive output and selects one of the Word Lines 12 for activation thereof. The memory cells in the row associated with the activated Word Line are then accessed and the contents thereof output on bit lines.

Each of the bit lines in the cell array 10 are connected to a column decode circuit 20 which has the output thereof connected to a data Input/Output (I/O) circuit 22 through a bus 24 which is comprised of a plurality of I/O data lines. The column decode circuit 20 receives a column address from a column address buffer 26. In the preferred embodiment, the column decode circuit 20 is operable to select multiple columns of memory cells for each column address received. Data written to or read from the accessed columns represent an N-bit word. Therefore, the cell array 10 is a "by-N" array.

The cell array 10 has a FLASH CLEAR input associated with a control line 28 which is connected to the output of a driver circuit 30. The driver circuit 30 has the input thereof connected to a FLASH CLEAR control signal. The cell array 10 is operable to preset all memory cells of selected columns of the memory cell array to logic 0's when the FLASH CLEAR signal is input to the driver 30, the selected columns being associated with a common I/O line. By comparison to an arrangement wherein all columns of a memory cell array are necessarily simultaneously flash cleared, the ability to selectively clear any I/O line in the cell array 10 results in lower drive requirements for the driver 30 and a lower associated noise level due to the lower drive current, as will be described in more detail hereinbelow.

Figure 2:
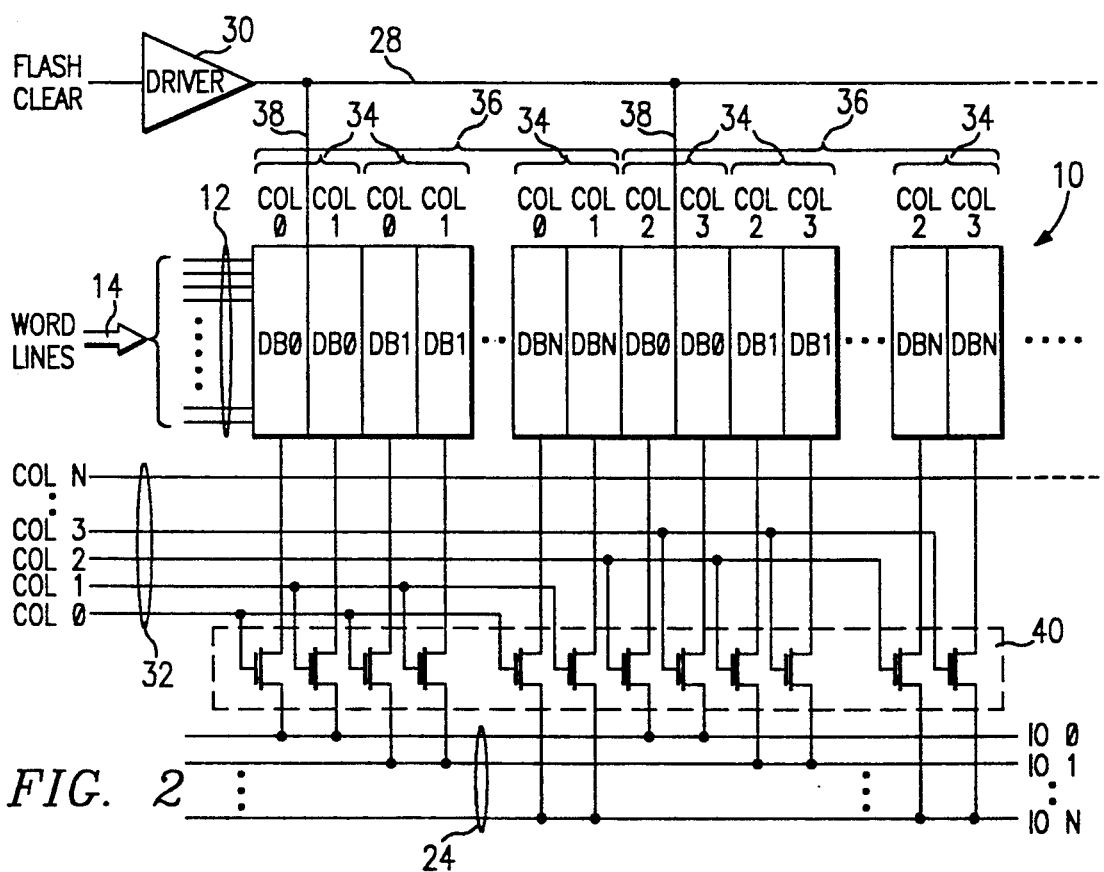
FIG. 2 illustrates the architecture of the cell array and the interface with the FLASH CLEAR driver circuitry.

Referring now to FIG. 2, there is illustrated a partial block diagram of cell array 10 utilizing the flash clearing scheme of the present invention. Typically, columns of memory cells in an integrated circuit are arranged to accommodate various layout considerations, column decoder schemes, etc., such that the columns are not necessarily topologically located in a sequential order relative to their associated I/O line; that is, columns associated with a given column address are not necessarily physically adjacent to each other.

In the preferred embodiment, columns that are associated with a particular one of the data bits DB∅-DBN are physically grouped together, each of the data bits DB∅-DBN being associated with a separate I/O line. As will be described hereinbelow, this allows selective clearing of all memory cells associated with a selected data bit. In the preferred embodiment all of the bit DB∅ are designated as the selected memory cells to be flash cleared. For reasons that will be described hereinbelow, columns associated with the memory cells to be flash cleared for the selected data bit, are physically disposed adjacent to each other in pairs. Each pair represents two adjacent column addresses, for example, Column ∅ and Column 1. This allows one control line to feed a pair of adjacent columns associated with the memory cells to be cleared.

For example, in the preferred embodiment, the column address COL ∅ will access memory cells for data bits DB∅-DBN associated with Column ∅. In a similar manner, the column address COL 1 will access memory cells for data bits DB∅-DBN associated with Column 1. The column of memory cells for the DB∅ data bits associated with the column address COL ∅, and the column of memory cells for the DB∅ data bits associated with the column address COL 1 are physically disposed adjacent each other with a single control line operative to clear the associated memory cells in response to the FLASH CLEAR signal.

Referring further to FIG. 2, the column decoder 20 outputs a plurality of column address lines 32 labelled COL ∅-COL N. Each of the column address lines 32 is associated with one of N+1 columns and each column address is associated with memory cells for data bits DB∅-DBN. Therefore, when a row of memory cells is accessed, the presence of the respective column address results in the data bits DB∅-DBN for the accessed row being output on the data bus 24.

The columns of memory cells are arranged in pairs 34 with each pair 34 representing two adjacent column addresses for a given one of data bits DB∅-DBN. The pairs 34 are organized in banks 36 with each bank representing all of the columns of memory cells for two adjacent column addresses. For example, in the first bank 36 in the memory array 10, the first pair 34 corresponds to the bits DB∅ for adjacent column addresses COL ∅ and COL 1. The next adjacent pair 34 corresponds to the data bits DB1 for adjacent column addresses COL ∅ and COL 1, with the last pair 34 in the first of the banks 36 corresponding to the data bits DBN for adjacent column addresses COL ∅ and COL 1. The next adjacent bank 36 corresponds to all of the data bits DB∅-DBN for adjacent column addresses COL 2 and COL 3, with the last bank 36 representing all of the data bits DB∅-DBN for adjacent column addresses COL (N-1) and COL N.

Each of the pairs 34 associated with the memory cells for data bits DB∅ in each of the banks 36 has a control line 38 connected to the FLASH CLEAR control line 28. The line 38 provides an interconnection to the FLASH CLEAR signal through driver 30, which clears all of the memory cells for bits DB0 for each bank and for each column address. However, it should be understood that any of the pairs 34 can be connected to the line 28 for the purposes of flash clearing the memory cells associated with that particular data bit. This allows the selection of all of the columns associated with a selected one of data bits DB0–DBN to be cleared. Further, for an alternative embodiment, this also allows for selection of a particular column address and memory cells for associated data bits DB0–DBN to be cleared. For example, the first bank 36 associated with the column addresses COL 0 and COL 1 could be selected such that only the memory cells for the first data bit DB0 associated with these two column addresses would be cleared. Although not described herein, this is merely a mask change which requires a jumper to be made from the control line 28, which runs adjacent to the array, to the appropriate terminal in pair 34.

Each of the I/O lines in bus 24 is interconnected to the output of an associated column through one of a plurality of transfer gates 40. Each of the transfer gates comprises an N-channel transistor having a source-to-drain path connected between the respective I/O line and the column output; the gate terminal of each transfer gate is connected to the associated one of the column address lines 32.

Figure 3:
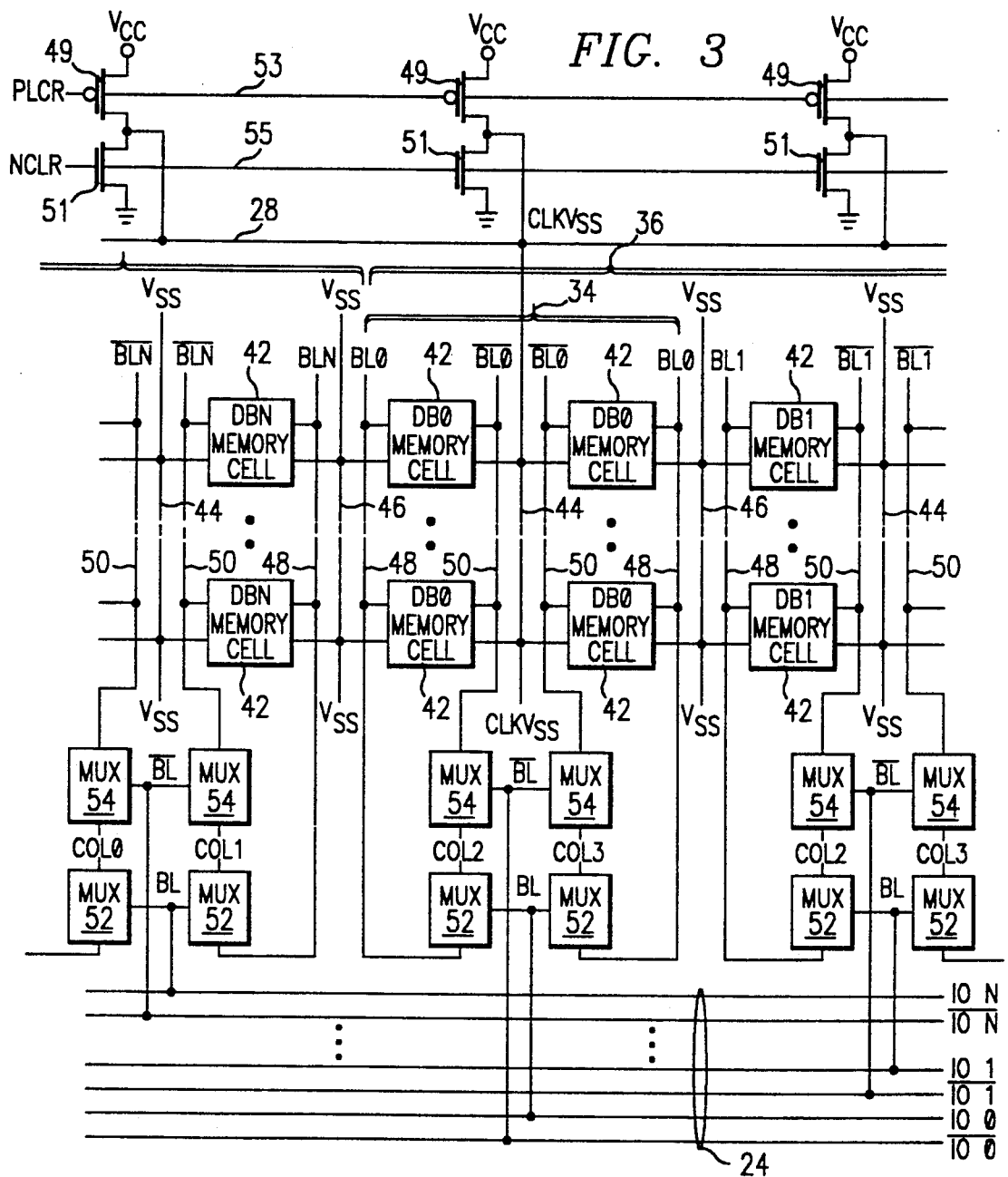
FIG. 3 illustrates a schematic diagram of four adjacent columns in the memory array.

Referring now to FIG. 3, there is illustrated a detailed schematic diagram of a portion of the cell array 10 illustrating the interconnections of memory cells 42. The memory cells 42 are arranged in rows and columns such that each memory cell 42 has a specific column and row address location. The wordlines associated with row addresses are not shown. For clarity purposes, the pair 34 in the set associated with the I/O 0 line and in the bank 36 associated with the column addresses COL 2 and COL 3 are illustrated. In addition, the column of memory cells 42 associated with both the column address COL 1 and the I/O N line, and the column of memory cells 42 associated with both the column address COL 2 and the I/O 1 line are illustrated.

Each of the memory cells 42 has associated therewith a Bit Line output and a Bit Line-bar output. It should be noted that in any given pair 34, the Bit Line-bar outputs of the associated memory cells 42 are physically located adjacent to one another, whereas the Bit Line outputs are disposed on the opposite sides of the memory cells 42, for reasons that will be described hereinbelow. Each of the memory cells 42 is coupled to two $V_{SS}$ input lines, a $V_{SS}$ input line 44 on the Bit Line-bar side of the memory cell 42 and a $V_{SS}$ input line 46 on the Bit Line side of the memory cell 42.

The $V_{SS}$ input lines 44 for the memory cells 42 in the pair 34 that are associated with the I/O 0 line are connected to line 28, which has a signal CLKVSS applied thereto. The remaining memory cells 42 associated with the I/O 1–I/O N lines have the ground reference voltage applied to the $V_{SS}$ input line 44. Each of the $V_{SS}$ input line 46 of all of the memory cells 42 are connected to the ground reference voltage. The CLKVSS signal is utilized to clear the memory cells to which it is coupled. Although the present embodiment only connects the $V_{SS}$ input line 44 of the memory cells 42 associated with the I/O 0 line to the control line 28 and the signal CLKVSS, it should be understood that any of the pairs 34 of columns of memory cells 42 could alternately have the $V_{SS}$ inputs 44 thereof selectively connected to the CLKVSS signal to allow FLASH CLEARing of the memory cells in those columns.

Each of the Bit Line outputs of the memory cells 42 is connected to one of a plurality of Bit Lines 48 and each of the Bit Line-bar outputs is connected to one of a plurality of Bit Line-bar lines 50. The Bit Line 48 for each of the columns of memory cells is connected to an associated multiplexer 52 and each of the Bit Line-bar lines 50 is connected to an associated multiplexer 54. The multiplexers 52 and 54 each comprise pass gates similar to the pass gates 40 in FIG. 2. Each of the I/O lines in bus 24 has an inverted and a non-inverted form. The inverted form thereof is connected to the output of multiplexer 54 and the non-inverted form is connected to the output of multiplexer 52.

It can be seen from the architecture illustrated in FIG. 3 that only one conductive line is required for the CLKVSS signal for a given pair 34 of columns of memory cells. This conductive line is associated with two columns having different column addresses and both columns being associated with the same I/O line, thereby allowing selective flash clearing of all cells associated with a given I/O line without requiring a separate conductive line for the CLKVSS signal to each column of memory cells. By alternating the orientation of the memory cells for a given row such that the Bit Line-bar output of adjacent columns of memory cells 42 are adjacent to each other, it is possible to provide one $V_{SS}$ input line 44 for receiving the CLKVSS signal. All that is required is a memory cell layout having the Bit Line and Bit Line-bar outputs on opposite sides of the cell.

The control line 28 is a conductive run having a distributed capacitance associated therewith and is driven by the driver 30 which comprises a distributed driver. A plurality of CMOS driver circuits are provided, the driver circuits each being represented by a P-channel transistor 49 and an N-channel transistor 51 connected in a complementary configuration between the positive supply $V_{CC}$ and a reference $V_{SS}$ or ground. The drain of the N-channel transistor 51 is connected to the line 28. The CMOS transistor drivers are comprised of transistors 49 and 51 and are distributed along the line 28. In such a manner, a low source impedance can be provided to the line 28. The gates of the P-channel transistors 49 are connected to a control line 53 and the gates of the N-channel transistors 51 are connected to a control line 55 representing the inverted and noninverted form of the FLASH CLEAR signal and are designated as PLCR and NCLR, respectively. PLCR and NCLR have the same value at all times. Therefore, the transistors 49 and 51 provide the drive necessary to supply the CLKVSS-signal whereby the voltage of the line 44 connected to the CLKVSS signal can readily be pulled from $V_{SS}$ to $V_{CC}$. It can be seen that a significantly decreased amount of drive is required to drive only the $V_{SS}$ input lines 44 associated with the I/O 0 lines as compared to the amount of drive which would be required to drive all of the cells in the memory array 10.

Figure 4:
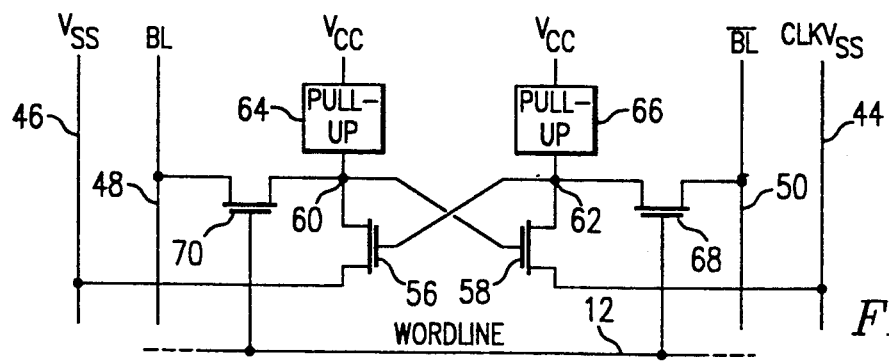
FIG. 4 illustrates a detailed schematic diagram of one memory cell.

Referring now to FIG. 4, there is illustrated a schematic diagram of one of the static memory cells 42. The memory cell 42 comprises a pair of cross-coupled N-channel transistors 56 and 58. Transistor 56 has the source thereof connected to the $V_{SS}$ input line 46, the drain thereof connected to a sense node 60 and the gate thereof connected to a sense node 62. Transistor 58 has the source thereof connected to the $V_{SS}$ input line 44, the drain thereof connected to the sense node 62 and the gate thereof connected to sense node 60. In the cell 42 illustrated in FIG. 4, the $V_{SS}$ input line 44 is connected to the CLKVSS line, and the $V_{SS}$ input line 46, as described above, is connected to $V_{SS}$, representing a cell that can be flash cleared. However, if the memory cell 42 is not to be flash cleared, the associated $V_{SS}$ input line 44 is connected to $V_{SS}$ rather than to CLKVSS. The source of transistor 58 therefore comprises the FLASH CLEAR input of the memory cell 42.

The sense node 60 is connected to a positive supply $V_{CC}$ through a pull-up transistor 64 and the sense node 62 is connected to the positive supply $V_{CC}$ through a pull-up transistor 66. Node 62 is connected to the Bit-Line-bar 50 through the source-to-drain path of an N-channel access transistor 68, the gate of which is connected to the Word Line 12 for the accessed row. In a similar manner, node 60 is connected to the Bit Line 48 through the source-to-drain path of an N-channel transistor 70, the gate of transistor 70 being connected to Word Line 12. The operation of the memory cell 42 with the $V_{SS}$ input line 44 connected to $V_{SS}$ is identical to a conventional SRAM cell. It should be noted that for the illustrated cell the clear input is on the right side of the cell whereas in the mirrored layout, the cell is mirrored about the center with the clear input on the left side of the cell.

In operation, the memory cell 42 is flash cleared by raising the line 44 from the voltage $V_{SS}$ to the voltage $V_{CC}$, which operation occurs when the voltages on both line 53 and line 55 go low, thus turning on transistors 49 and turning off transistors 51. When the memory cell 42 is cleared, the non-inverted node 60 is disposed at a low voltage representing a logic "0" and the inverted node 62 is disposed at a high voltage representing a logic "1".

When a logic "1" is stored in the memory cell 42, node 62 is disposed at a low voltage at or near $V_{SS}$; in this condition transistor 58 is turned on and transistor 56 is turned off. To clear this logic state and force node 62 to a high voltage, the voltage on the source of transistor 58 is pulled to a high voltage such that transistor 58 acts as a source follower and pulls the voltage on node 62 high. This in effect turns on transistor 56, pulling node 60 low, which results in transistor 58 being turned off, such that when the voltage on line 44 is pulled back low, transistor 58 is off and node 62 is high. This provides a clearing operation that does not require any interaction by the row decoder to write logic "0" information from the Bit Lines into the memory cell for the clear operation and, additionally, only minimal power is required.

From a power standpoint, sufficient current is required to overcome the capacitive loading on the drain of transistor 58 from each of the memory cells associated therewith. If all the memory cells 42 in the array 10 were cleared, this would require a high driving current to overcome the capacitive loading, but by clearing only selected I/Os, the capacitive loading and required drive current can be substantially decreased. Further, supplying the CLKVSS signal to all of the memory cells 42 in the array 10 would result in a higher noise level distributed across the memory array 10, and thereby increasing the possibility of an error.

Figure 5:
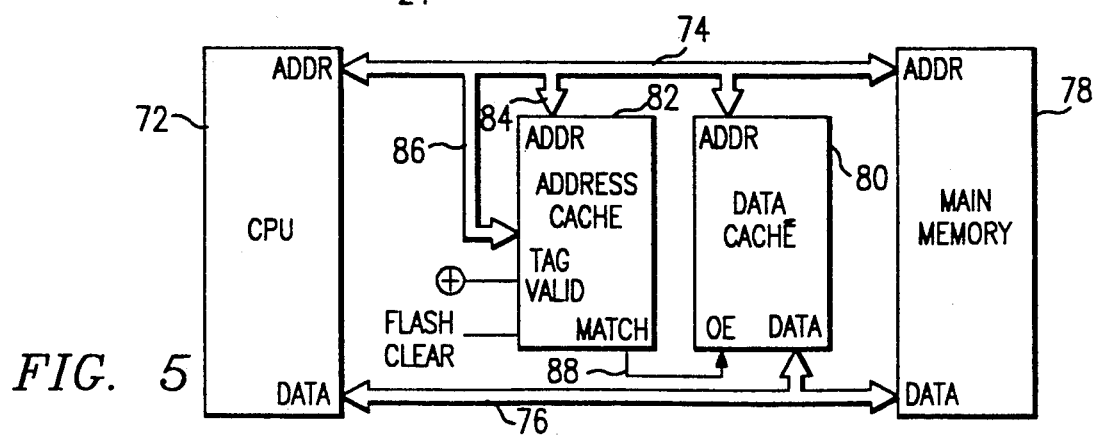
FIG. 5 illustrates a schematic block diagram of a cache memory scheme utilizing the system of the present invention.

Referring now to FIG. 5, there is illustrated a schematic block diagram of a cache memory system illustrating the FLASH CLEAR scheme of the present invention. In the cache memory scheme, a central processing unit (CPU) 72 provides an address output connected to an address bus 74 and a data I/O connected to a data bus 76. The address bus 74 is connected to the address input of a main memory 78, the data input thereof being connected to the data bus 76. The address bus 74 is also input to a data cache 80 with the data input of the data cache 80 connected to the data bus 76. An address cache 82 is also provided which has an address input and a data input, the data input representing the tag information. The address input of the address cache 82 is connected to the three least significant bits of the address through the bus 84. The tag input is connected to the three most significant bits of the address bus 74 through a bus 86. In addition, the address cache 82 has one of the data bits thereof connected to a positive voltage through a pull-up resistor (not shown). The FLASH CLEAR signal is also input to the address cache 82.

The address cache 82 is operable to receive the three least significant bits of the address output by the CPU and to output the addressed location and compare it with the information on the bus 86. If a true comparison is made, a match signal is generated and output on a line 88 to the Output Enable input of the data cache 80. The tag information is stored during a Write operation, which will not be described. When a match is present, this is termed a "hit", which results in the data stored in the data cache 80 being output on the data bus 76. The access time to the data cache as compared to the access time to the main memory 78 is approximately ten times faster, resulting in increased speed.

The FLASH CLEAR input allows the valid bit in the address cache 82 to be cleared without requiring the rest of the memory locations in the address cache 82 to be cleared. As described above, the clearing of selected I/Os removes the requirement for clearing all of the memory locations, thus resulting in lower drive requirements, improved noise levels during clear, etc.

In summary, there has been provided a static random access memory having multiple I/Os with the capability of clearing a selected I/O. The memory is configured such that all columns of memory cells associated with the given I/O can be selectively connected to a clear signal. Further, columns of memory cells for a selected I/O and for two adjacent column addresses are physically disposed adjacent to each other such that they can share a common conductive run disposed parallel to each of the columns and connected to the clear signal. In such a manner, pairs of memory cells associated with the same I/O can be cleared, thus reducing layout constraints.

Although the preferred embodiment has been described in detail, it should be understood that various changes, substitutions and alterations can be made therein without departing from the spirit and scope of the invention as defined by the appended claims.

What is claimed is:

1. A memory array with selectively clearable memory cells, comprising:
   an array of memory cells arranged in rows and columns, each of said rows of memory cells associated with a separate row address and said columns arranged in predetermined groups of an equal number of said columns, wherein the columns of a selected group are further arranged in pairs with each pair sharing a common conductive run, and wherein each of the columns within said groups are associated with a separate column subaddress and arranged in a predetermined sequence within said groups with each of said groups associated with a predetermined column address sequence;

each of said memory cells operable to store first and second logic states therein and each having a flash clear input for forcing the logic state stored therein to said first logic state in response to receiving a flash clear signal, the flash clear inputs for said memory cells in a given one of said columns being commonly connected together by the common conductive run shared with the paired column;

row address decode means for receiving and decoding an external row address and accessing the associated one of said rows of memory cells;

column address decode means for receiving and decoding an external column address and selecting the associated one of said groups of columns of said memory cells;

select means for receiving the flash clear signal and routing it to the common conductive runs associated with predetermined groups of columns in said predetermined sequence such that all of said columns associated with said selected column address have the logic states in the associated ones of said memory cells forced to said first logic state when said flash clear signal is generated independent of the value of the bit lines; and I/O means for interfacing with the accessed ones of said memory cells for inputting data thereto for a Write operation and outputting data therefrom for a Read operation;

wherein the flash clear signal has a voltage equal to either a logical one or a logical zero as stored in the array.

2. The memory of claim 1 wherein said memory cells are static memory cells.

3. The memory of claim 1 wherein said common conductive runs have a distributed capacitance associated therewith and said selection means comprises:
a second conductive run having a distributed capacitance associated therewith and disposed proximate to each of said common conductive runs;
interconnection means for selectively interconnecting the ones of said common conductive runs associated with said selected columns with said second conductive run; and
driver means for driving said second conductive run with said flash clear signal and interconnected ones of said common conductive runs.

4. The memory of claim 1 wherein:
said flash clear signal has a first state at a first voltage level and a second state at a second voltage level and each of said memory cells is operable to force the logic state stored therein to said first logic state when said first voltage level is applied to the flash clear thereof, and said memory cells not having the logic state thereof altered when said second voltage level is applied to the flash clear input thereof; and
said select means is operable to apply said first voltage level to the flash clear inputs of said memory cells in the selected ones of said columns and said second voltage level to the flash clear inputs of said memory cells in the unselected ones of said columns when said flash clear signal is present.

5. The memory of claim 4 wherein said select means comprises:

a second conductive run disposed adjacent to said array proximate to each of said common conductive runs;
means for applying said first voltage level to said second conductive run when said flash clear signal is present;
first means for connecting said second conductive run to the common conductive runs.

6. The memory of claim 5 wherein said means for applying said first voltage level to said second conductive run comprises a driver having the input thereof interfaced with said flash clear input and the output thereof operable to drive said second conductive run wherein said common and second conductive runs have a distributed capacitance associated therewith.

7. The memory of claim 5 wherein said second conductive run is disposed adjacent to said array and perpendicular to said common conductive runs, and said first means for connecting comprises a conductive interconnect between the ones of said common conductive runs said second conductive run.

8. The memory of claim 4 wherein each of said memory cells comprises:
a first sense node;
a second sense node;
a first transistor having a source-to-drain path connected between said first sense node and a node providing a second voltage level and the gate thereof connected to said second sense node;
a second transistor having a source-to-drain path thereof connected between said second sense node and the flash clear input and the gate thereof connected to said first sense node;
first pull up means connected between said first sense node and a power supply for pulling said first sense node to the voltage of said power supply when said first transistor is not conducting;
second pull up means connected between said second sense node and said positive supply for pulling said second sense node to the voltage of said power supply when said first transistor is not conducting; and
an access transistor having the source-to-drain path thereof connected between said first sense node and said column address decode means and the gate thereof connected to said row address decode means;
wherein said first sense node is forced to a voltage level corresponding to said first logic state when the flash clear input is raised to said first voltage level.

9. The memory of claim 3, wherein the driver means comprises:
a plurality of driver circuits distributed along the second conductive run, wherein the driver circuits simultaneously drive a flash clear signal onto the second conductive run.

10. The memory array of claim 9, wherein the driver circuits are spaced at regular intervals along the second conductive run across one dimension of the array, and are aligned with all of the columns in the array, including those not connected to common conductive runs.

11. The memory of claim 5, wherein the driver comprises:
a plurality of driver circuits distributed along the second conductive run, wherein the driver circuits simultaneously drive a flash clear signal onto the second conductive run 12. The memory array of claim 11, wherein the driver circuits are spaced at regular intervals along the second conductive run across one dimension of the array, and are aligned with all of the columns in the array, including those not connected to common conductive runs.

13. The memory array of claim 1, wherein each group of columns corresponds to a single data bit position, wherein the memory cells in at least one selected group of columns is forced to the first logic state when the flash clear signal is generated, and wherein the memory cells in the remaining groups of columns do not change value when the flash clear signal is generated.

14. The memory array of claim 13, wherein the at least one group of selected columns comprises exactly one group of columns.

15. A memory array with selectively clearable memory cells, comprising:
   an array of SRAM cells arranged in rows and columns, wherein the columns are divided into groups representing a plurality of bit positions;
   means for selecting columns within each group utilizing a subcolumn address;
   each of the memory cells operable to store first and second logic states therein, and those cells in the columns of at least one group having flash clear inputs for forcing the logic state within such cells to the first logic state in response to receiving a flash clear signal at the flash clear input;
   a common conductive run between pairs of the columns having cells with flash clear inputs, wherein the flash clear inputs for the cells in the pair are connected to the common conductive run between them; and
   select means for receiving a flash clear signal, and driving the common conductive runs with a flash clear signal so as to force the cells in the pairs of columns associated therewith to the first logic state.

16. The memory array of claim 15, further comprising:
   a second conductive run disposed orthogonally to the common conductive runs in proximity therewith;
   interconnection means for selectively interconnecting the common conductive runs with the second conductive run; and
   driver means for driving the second conductive run with the flash clear signal.

17. The memory array of claim 16, wherein the driver means comprises:
   a plurality of driver circuits distributed along the second conductive run, wherein the driver circuits simultaneously drive a flash clear signal onto the second conductive run.

18. The memory array of claim 17, wherein the driver circuits are spaced at regular intervals along the second conductive run across one dimension of the array, and are aligned with all of the columns in the array, including those not connected to common conductive runs.

19. The memory array of claim 15, wherein each group of columns corresponds to a single data bit position, wherein the memory cells in at least one selected group of columns is forced to the first logic state when the flash clear signal is generated, and wherein the memory cells in the remaining groups of columns do not change value when the flash clear signal is generated.

20. The memory array of claim 19, wherein the at least one group of selected columns comprises exactly one group of columns.

* * * * *